US006361405B1

(12) United States Patent
David et al.

(10) Patent No.: US 6,361,405 B1
(45) Date of Patent: Mar. 26, 2002

(54) UTILITY WAFER FOR CHEMICAL MECHANICAL POLISHING

(75) Inventors: Jeffrey D. David, Sunnyvale; Benjamin A. Bonner, San Mateo; Thomas H. Osterheld, Mountain View; Sidney Huey, Milpitas, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/544,734

(22) Filed: Apr. 6, 2000

(51) Int. Cl.⁷ .................................................. B24B 1/00
(52) U.S. Cl. ............................................ 451/41; 451/44
(58) Field of Search .......................... 451/41, 44, 65, 451/56, 288

(56) References Cited

U.S. PATENT DOCUMENTS

| 4,783,225 A | * | 11/1988 | Maejima et al. | 451/41 |
| 5,097,630 A | * | 3/1992 | Maeda et al. | 451/65 |
| 5,117,590 A | * | 6/1992 | Kudo et al. | 451/44 |
| 5,226,101 A | * | 7/1993 | Szentesi et al. | 451/41 |
| 5,271,185 A | * | 12/1993 | Hosokawa | 451/44 |
| 5,295,331 A | * | 3/1994 | Honda et al. | 451/44 |
| 5,317,836 A | * | 6/1994 | Hasegawa et al. | 451/44 |
| 5,582,536 A | * | 12/1996 | Kagamida | 451/56 |
| 5,727,990 A | * | 3/1998 | Hasegawa et al. | 451/44 |
| 5,890,951 A | | 4/1999 | Vu | 451/56 |
| 5,944,584 A | * | 8/1999 | Toyoma | 451/41 |
| 5,944,590 A | * | 8/1999 | Isobe et al. | 451/288 |
| 6,159,081 A | * | 12/2000 | Hakomori | 451/44 |
| 6,174,222 B1 | * | 1/2001 | Sato et al. | 451/44 |

* cited by examiner

Primary Examiner—Derris H. Banks
Assistant Examiner—Hadi Shakeri
(74) Attorney, Agent, or Firm—Moser, Patterson and Sheridan

(57) ABSTRACT

A utility wafer, more specifically, an utility wafer for simulating a workpiece in a semiconductor processing system. The utility wafer includes a first side, a second side and a peripheral edge wherein one or both edges of the peripheral edge are relieved to remove the otherwise sharp edge. In one embodiment, the peripheral edge is polished. The utility wafer is resistant to chipping, stress cracking and breakage when undergoing chemical mechanical planarization.

15 Claims, 2 Drawing Sheets

UTILITY WAFER FOR CHEMICAL MECHANICAL POLISHING

BACKGROUND OF THE DISCLOSURE

1. Field of Invention

The present invention relates generally to chemical mechanical polishing, and more specifically, to the use of utility wafers for simulating chemical mechanical polishing processes.

2. Background of Invention

In semiconductor wafer processing, the use of chemical mechanical planarization, or CMP, has gained favor due to the enhanced ability to stack multiple devices on a semiconductor workpiece, or substrate, such as a wafer. As the demand for planarization of layers formed on wafers in semiconductor fabrication increases, the requirement for greater system (i.e., process tool) throughput with less wafer damage and enhanced wafer planarization has also increased.

Two exemplary CMP systems that address these issues are described in U.S. Pat. No. 5,804,507, issued Sep. 8, 1998, to Perlov et al., and in U.S. Pat. No. 5,738,574, issued Apr. 15, 1998, to Tolles et al., both of which are hereby incorporated by reference. Perlov et al. and Tolles et al. disclose a CMP system having a planarization apparatus that is supplied wafers from cassettes located in an adjacent liquid filled bath. A transfer mechanism, or robot, facilitates the transfer of the wafers from the bath to a transfer station. The transfer station generally contains a load cup that positions the wafer into one of four processing heads mounted to a carousel. The carousel moves each processing head sequentially over the load cup to receive a wafer. As the processing heads fill, the carousel moves the processing head and wafer through the planarization stations for polishing. The wafers are planarized by moving the wafer relative to a polishing pad in the presence of a slurry or other polishing fluid medium.

The polishing pad may include an abrasive surface. Additionally, the slurry may contain both chemicals and abrasives that aid in the removal of material from the wafer. After completion of the planarization process, the wafer is returned back through the transfer station to the proper cassette located in the bath.

The ideal substrate polishing process can be described by Preston's equation:

$$R = K_P P \frac{\Delta s}{\Delta t}$$

where:

R is the removal rate;

$K_p$ is the Preston coefficient;

P is the applied pressure between the workpiece and the abrasive pad; and $\Delta s/\Delta t$ is the linear velocity of the abrasive pad relative the workpiece.

Preston's equation has shown to be a reasonably accurate model for the planarization of silicon dioxide, copper and tungsten, although the dependence of $K_p$ on process variables, such as slurry composition and pad properties, is not well understood. For example, the theoretical value of the Preston coefficient Kp=1/2E (where E is Young's modulus of the surface being polished) does not explain the polishing rate variation with other important process variables such as pad type, pad condition, slurry abrasive and slurry chemicals. Illustrative of this is that the polishing rate has been known to vary as much as 20 percent between pads having different hardness. As a result, most chemical mechanical polishing process modeling is performed using empirical data.

To better predict the results of an actual chemical mechanical polishing process, typically a simulation of the processes is performed using utility wafers in the place of production wafers. Generally, the simulation comprises running a number of utility wafers through the chemical mechanical polishing system, while periodically inserting and polishing a test wafer from which the polishing attributes can be obtained to construct a model of the polishing process. For example, in an exemplary CMP simulation, approximately 2000 polishing cycles are run. After every 100 utility wafers that are polished, a test wafer is polished, removed and measured to obtain data indicative the process. Once approximately 2,000 polishing cycles are completed, a data base representative of the process can be constructed. Other simulations may be configured to run more or less polishing cycles, and may polish test wafers at different frequencies.

The utility wafers typically used to simulate the polishing of the production wafers generally are silicon wafers covered with a thin layer of oxide. Generally, the oxide layer can only withstand one to two polishing cycles through the chemical mechanical polishing system. The utility wafer, once the oxide has been substantially removed by polishing, can be reused after being stripped of the remaining oxide coating and a new layer of oxide is redeposited thereon. As the cost of depositing an oxide layer is not nominal, simulation tests that use between 1,500–2,000 utility wafers can become quite costly.

One solution to the high cost of the oxide coated silicon wafers is described in U.S. Pat. No. 5,890,951, issued Apr. 6, 1999, to Cuong van Vu. Cuong van Vu teaches a utility wafer used for mechanically conditioning and stabilizing a polishing pad. This utility wafer is comprised of a high purity solid ceramic or metal member that has a thickness of between about 3–150 mils. The thickness of the Cuong van Vu utility wafer provides some resistance to breaking when the wafer is exposed to the forces applied in a chemical mechanical planarization process. For example, Cuong van Vu teaches a quartz wafer thickness of 50 mils, and a silicon/quartz composite wafer that can withstand the surface tension forces experienced during the removal of the polished wafer from the polishing pad (dechucking) without breaking or cracking the wafer.

However, ceramic wafers of this type are prone to chipping as the edge of the wafer contacts the retaining ring of the polishing head during the planarization process, during dechucking from the polishing pad, or during handling in general. As the wafer contacts the retaining ring, pieces of material break off from the corners and stress cracks tend to propagate from the chipped edges as the wafer contacts against the retaining ring. These chips and cracks generally lead to premature failure of the utility wafer.

Therefore, there is a need in the art for a utility wafer that provides a durable, low cost means for simulating a wafer in a chemical mechanical polishing system.

SUMMARY OF INVENTION

In one aspect, a utility wafer is provided which generally includes a first side and a second side opposing the first side and defining a thickness therebetween. A peripheral edge couples the first side and the second side. An edge defined at the interface of the peripheral edge and the first side is relieved, i.e., the edge has a chamfer, radius or other relief. Optionally, a second edge at the interface of the peripheral edge and the second side is also relieved. In another embodiment, the peripheral edge is polished.

In another aspect, a method for fabricating a utility wafer is provided. The method generally comprises providing a wafer having a thickness of at least about 45 mils relieving at least one edge of the wafer and polishing the wafer. In one embodiment the wafer is laser polished and annealed.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF INVENTION

Figure 1:
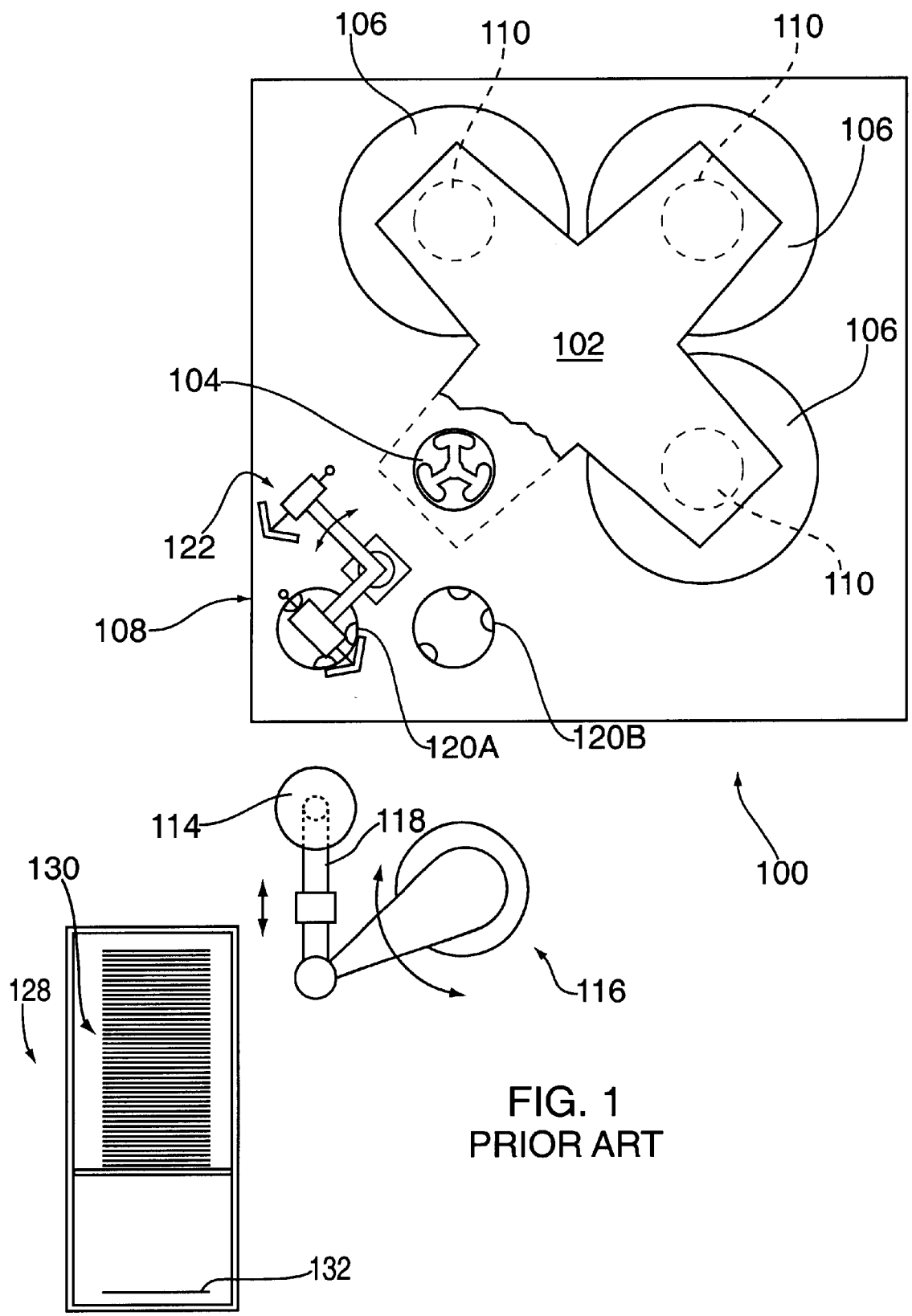
FIG. 1 is a schematic plan view of a chemical mechanical planarization system.

FIG. 1 depicts a schematic plan view of an exemplary chemical mechanical polisher 100. The polisher 100 has a plurality of polishing stations 106 (e.g., three), a carousel 102 that supports four polishing heads 110, a wafer load/unload assembly 104, and a transfer station 108. An input/output robot 116 loads and unloads wafers 114 to/from the transfer station 108. Four polishing heads 110 are mounted in the carousel 102. The carousel 102 is partially cut-away to provide a view of the components of the transfer station 108. As such, one of the four polishing heads 110 is not shown. The carousel 102 rotates about a central axis such that any one of the polishing heads 110 may be positioned at any one of the polishing stations 106 or the transfer station 108. Consequently, the wafer 114 can be loaded into a particular polishing head 110, and the carousel 102 can move the head 110 to a particular polishing station 106.

The wafer 114 may be a production wafer, a test wafer or a utility wafer. Generally, the wafer 114 is transferred between the polisher 100 and other systems (e.g., wafer cleaners) or at least one wafer cassette 128 via the wafer input/output robot 116. The input/output robot 116 has a gripper 118 (e.g., a vacuum gripper) that retains the wafer 114 during transfer between the transfer station 108 and the wafer cassette 128. In normal wafer processing, the wafer cassette 128 holds production wafers. During simulations of wafer processing, the wafer cassette typically holds a plurality of utility wafers 130, and one or more test wafers 132.

The transfer station 108 comprises at least one buffer station 120 (preferably, two buffer stations 120A and 120B) and a transfer robot 122. The input/output robot 116 places the wafer 114 that is entering the polisher 100 into the input buffer station 120B. After the transfer station 108 receives the wafer 114 from the robot 116 and the robot 116 has cleared the transfer station 108, the transfer station robot 122 retrieves the wafer 114 from the input buffer station 120B and moves the wafer 114 to the wafer load/unload assembly 104. The wafer load/unload assembly 104 positions the wafer 114 into a polishing head 110. The transfer station 108 may be of any type known in the art for transferring a wafer between input/output robot and a polishing head. Preferably, the transfer station 108 is a transfer station that is described in commonly assigned U.S. Patent application Ser. No. 09/414,771, filed Oct. 6, 1999, to Tobin, and is incorporated herein by reference.

The carousel 102 retrieves the wafer 114 from the wafer load/unload assembly 104 and proceeds to polish the wafer 114. While the transfer robot 122 is busy moving a wafer 114 from the buffer station 120 to the wafer load/unload assembly 104, the input/output robot 116 may position another wafer 114 into the empty input buffer station 120B.

When the wafer 114 has completed a polishing procedure, the carousel 102 moves the wafer 114 to the wafer load/unload assembly 104 and releases the wafer 114. The transfer robot 122 then retrieves the wafer 114 from the wafer load/unload assembly 104 and places the wafer 114 into the output buffer station 120A. The polished wafer 114 is then retrieved from the output buffer station 120B by the input/output robot 116.

Figure 2:
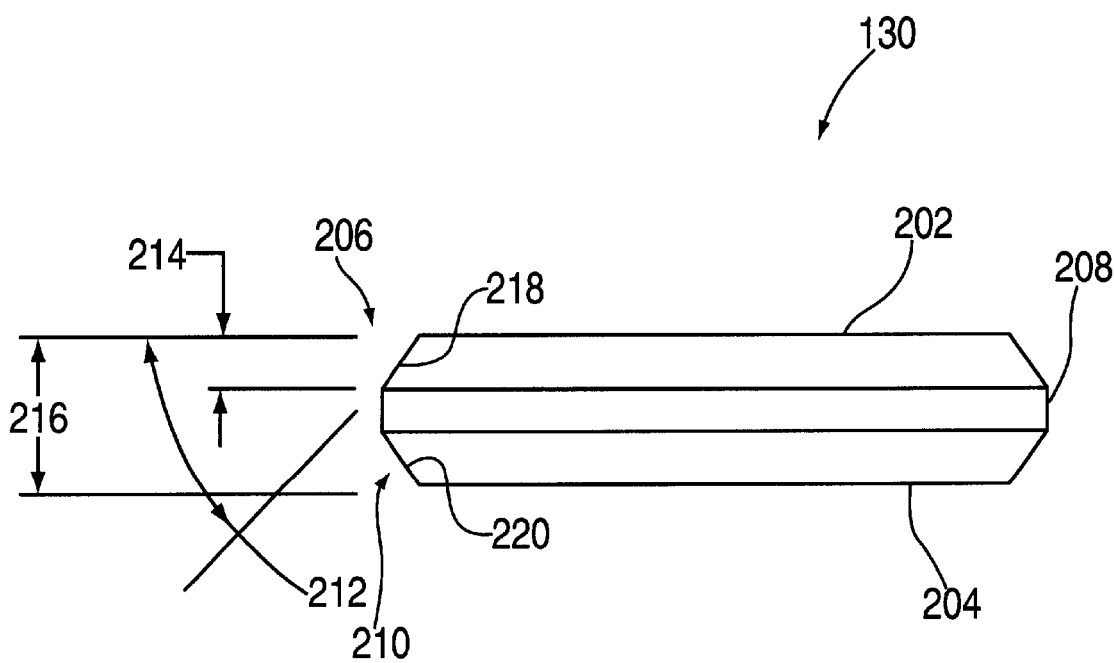
FIG. 2 is an elevation of a utility wafer.

FIG. 2 depicts embodiment of a utility wafer 130 according to the invention. The utility wafer 130 is typically fabricated out of a ceramic material. In one embodiment, the utility wafer 130 substantially comprises quartz. The utility wafer 130 has a first side 202, a second side 204 side and a peripheral edge 208. Optionally, one of the first or second sides 202, 204 may comprise a reflective coating. Generally, the first side 202 is substantially parallel to the second side 204 and defines a thickness 216 of at least 1.5 mm. One skilled in the art will appreciate that although thinner wafers will provide some utility, thicker wafers will allow for a greater number of passes through the polisher 100. Tests have shown that a thickness of 1.5 mm will exhibit a life in excess of 100 polishing cycles.

The first side 202 and the peripheral edge 208 come together to form a first edge 206. The second side 204 and the peripheral edge 208 come together to form a second edge 210. At least one of the edges 206, 210 is relieved to remove the otherwise sharp edge by chamfering, providing a radius, tapering, undercutting or other relief for removing the sharp edge.

In one embodiment the first edge 206 comprises a first chamfer 218. The first chamfer 218 generally has an angle 212 that ranges between about 30 to about 60 degrees relative the first side 202. One skilled in the art will appreciate that other angles 212 may be utilized. The first chamfer 218 extends a distance 214 along the peripheral edge 208. As the utility wafer 130 is polished and material is removed from the face 202, the distance 214 will diminish. In one embodiment, the distance 214 is at least about 0.5 mm before initial polishing. The first chamfer 218 removes the sharp corner that would otherwise be present at the interface of the first side 202 and peripheral edge 208. The first chamfer 206 thus minimizes the probability of chipping and the propagation of stress fractures through the utility wafer 130 when the peripheral edge 208 comes into contact with other objects such as, for example, a retaining ring of the polishing head 110. One skilled in the art will appreciate that other relief geometries, chamfer angles and distances may be readily substituted without departing from the teachings herein. For example, the first edge 206 may alternatively comprise a radius of at least 5 mils.

Optionally, the second edge 210 may comprise a second chamfer 220 opposite the first chamfer 206. Typically, the second chamfer 220 is fabricated identically to the first chamfer 218, although the relative geometry of the chamfers 218, 220 will vary as the utility wafer 130 is polished. One skilled in the art will appreciate that the relief at the first edge 206 may be different than the relief at the second edge 210, i.e., the first edge 206 may be chamfered while the second edge 210 has a radius.

In another embodiment, the peripheral edge 208 of the utility wafer 130 is optionally polished after relieving one or both of the edges 206, 210. Polishing generally fuses the peripheral edge 208 of the utility wafer 130 such that any cracks or chips that may be present at the peripheral edge 208 and particularly the edges 206 and 210, do not propagate into fractures or allow chips to be generated. Moreover, the fused peripheral edge 208 typically has more impact resistance, and is less prone to chipping than a non-fused surface. Polishing is generally in the form of heat polishing such as laser polishing or flame polishing. Optionally, polishing may be followed by annealing at an elevated temperature of, for example, about 1165° C. Prior to annealing, the utility wafer 130 should be cleaned to remove surface contamination.

Referring to FIGS. 1 and 2, in operation, a simulation of a chemical mechanical planarization process can be performed by processing a plurality of utility wafers 130 through the polisher 100, while periodically processing the test wafer 132 at predetermined intervals during the simulation. In an exemplary test sequence, approximately twenty-five utility wafers 130 and at least one test wafer 132 are loaded into the wafer cassette 128. The input/output robot 116 retrieves one of the utility wafers 130 from the cassette 128 and places the utility wafer 130 (shown as wafer 114 retained by robot 116) on the transfer station 108. The transfer station 108 transfers the utility wafer 130 to the load/unload assembly 104 where the utility wafer is loaded one of the four polishing heads 110 mounted to the carousel 102.

The utility wafer 130 is then moved to a polishing station 106 and polished. Once polishing is complete, the utility wafer 130 is returned to the cassette 128 and another utility wafer is retrieved and polished. This sequence repeats until a predetermined quantity of utility wafers 130 are polished. If the required number of passes through the polisher 100 are greater than the number of utility wafers 130 in the cassette 128, then the utility wafers 130 passed through the polisher more than once as required.

Once the predetermined number of utility wafers 130 have been polished, the test wafer 132 is retrieved from the cassette 128 and processed in the polisher 100. Once processed, the test wafer 132 is returned to the cassette 128 and another sequence of polishing the utility wafers 130 are preformed. The test wafer 132 is measured (typically remotely or in the polisher 100 before transfer to the cassette 128) to acquire data indicative of the polishing process. An example, thickness of an oxide layer may be measured to indicate polishing rate and uniformity of the polishing process.

The cycle of polishing a number of utility wafers 130 followed by a test wafer 132 is repeated until the predetermined number of cycles through the polisher 100 have completed. Data from test wafer 132 is compiled to create a data base from which a model of the polishing process just simulated can be constructed.

Although the teachings of the present invention that have been shown and described in detail herein, those skilled in the art can readily devise other varied embodiments that still incorporate the teachings and do not depart from the spirit of the invention.

What is claimed is:

1. A ceramic utility wafer for use in a semiconductor wafer planarization system comprising:

a first side;

a second side opposing the first side, wherein the first side and second side define a thickness of at least about 1.5 mm therebetween; and a fused peripheral edge integral to the first side at a first edge, the first edge having a chamfer or radius.

2. The utility wafer of claim 1, wherein the chamfer is between about 30 to about 60 degrees relative the first side.

3. The utility wafer of claim 1, wherein the chamfer is at least 0.5 mm along the peripheral edge.

4. The utility wafer of claim 1, wherein the fused peripheral edge is further integral to the second side at a second edge, the second edge being relieved.

5. The utility wafer of claim 1, wherein the radius is 5 mils.

6. The utility wafer of claim 1, wherein the fused peripheral edge is annealed.

7. A quartz utility wafer for use in a semiconductor wafer planarization system comprising:

a first side;

a second side opposing the first side, wherein the first side and second side define a thickness of at least about 1.5 mm therebetween; and a fused and annealed peripheral edge integral to the first side at a first edge, and integral to the second side at a second edge, the first edge and the second edge being chamfered at least 0.5 mm along the peripheral edge.

8. The utility wafer of claim 1, wherein the peripheral edge is fused by flame or laser polishing.

9. The utility wafer of claim 7, wherein the peripheral edge is fused by flame or laser polishing.

10. A method of fabricating a utility wafer comprising:

providing a disk-shaped quartz body having a thickness of at least about 1.5 mm;

relieving at least a first edge of a perimeter of the quartz body; and fusing including the perimeter including the relieved first edge.

11. The method of claim 10, wherein the step of fusing further comprises:

heating or laser polishing the quartz body.

12. The method of claim 10, further comprising:

annealing the fused quartz body.

13. The method of claim 10, further comprising:

relieving a second edge of the perimeter prior to fusing.

14. A method of fabricating a utility wafer comprising:

providing a disk-shaped quartz body having a thickness of at least about 1.5 mm;

relieving with a chamfer or radius a perimeter of the quartz body; and fusing including the perimeter; and annealing the fused quartz body.

15. The method of claim 14, wherein the step of fusing further comprises:

heating or laser polishing the quartz body.

\* \* \* \* \*